United States Patent
Clunn

(10) Patent No.: US 6,191,589 B1
(45) Date of Patent: Feb. 20, 2001

(54) TEST CIRCUIT FOR AN AFCI/GFCI CIRCUIT BREAKER

(75) Inventor: Robert Henry Clunn, Richardson, TX (US)

(73) Assignee: George A. Spencer, Plano, TX (US)

( * ) Notice: Under 35 U.S.C. 154(b), the term of this patent shall be extended for 0 days.

(21) Appl. No.: 09/277,879

(22) Filed: Mar. 29, 1999

(51) Int. Cl.[7] .............................. G01R 31/02; H02H 3/00
(52) U.S. Cl. ........................... 324/424; 324/127; 361/42
(58) Field of Search ............................. 324/424, 127, 324/158.1; 361/42; 703/18

(56) References Cited

U.S. PATENT DOCUMENTS

| | | | |
|---|---|---|---|
| 5,027,059 | 6/1991 | deMontgolfier et al. | 324/127 |
| 5,459,630 | * 10/1995 | MacKenzie | 361/45 |
| 5,642,052 | * 6/1997 | Earle | 324/556 |
| 5,747,980 | 5/1998 | Gershen | 323/356 |
| 5,834,940 | * 11/1998 | Brooks et al. | 324/424 |
| 5,835,322 | 11/1998 | Smith et al. | 361/42 |
| 5,982,593 | * 11/1999 | Kimblin et al. | 361/42 |

* cited by examiner

Primary Examiner—Safet Metjahic
Assistant Examiner—Anjan K Deb
(74) Attorney, Agent, or Firm—Howison, Chauza, Handley & Arnott, LLP

(57) ABSTRACT

A novel toroidal core current sensor for an AFCI/GFCI Circuit Breaker and a test circuit configuration based thereon is disclosed. The current sensor has a plurality of load current conductors extending therethrough. One of the conductors carrying a load current has a portion of the load current shunted outside the core through a shunt conductor which is connected in parallel with one of the load current conductors. The secondary of the transformer outputs a current value proportional to and substantially less than the load current which may be, for example, detected by a control circuit which compares the current value against predetermined stored criteria and operates a circuit breaker accordingly. In the test circuit a power source and a waveform generator are provided for operating an AFCI\GFCI circuit breaker having the shunted current sensor and injecting test signals into a terminal of the circuit breaker. The unique properties of the shunted current sensor permit a wide range of fault conditions to be applied at low signal power because of the relatively high sensitivity the shunted current sensor provides to the AFCI\GFCI circuit breaker.

42 Claims, 5 Drawing Sheets

TEST CIRCUIT FOR AN AFCI/GFCI CIRCUIT BREAKER

CROSS REFERENCE TO THE RELATED APPLICATIONS

The present application is related to a co-pending U.S. patent application Ser. No. 09/280,335, filed of even date herewith, and entitled "Current Sensor".

TECHNICAL FIELD OF THE INVENTION

The present invention is related to current sensors, and more specifically to current sensors for AFCI/GFCI circuit breakers.

BACKGROUND OF THE INVENTION

According to one report from the National Fire Protection Association data, there are 42,900 fires per year due to electrical equipment. These fires cause $615 Million property damage and 370 lives to be lost every year. Of these fires 15,200 are due to fixed wiring, 7,800 are due to cords and plugs, and 8,400 are due to lamp and light fixtures. The Consumer Product Safety Commission in a 1987 study found that fires are located in every area of residential dwellings; bedrooms, living rooms, kitchens, closet/storage areas, garages, bathrooms, laundry rooms, halls, and dining rooms (in decreasing order of occurrence).

Today circuit breakers only protect overload and short circuit conditions which occur primarily in fixed wiring. The overload protection is provided by the slow heating of a bimetal strip which breaks the circuit and the breaker trips after a specified period of time. The more current that runs through the bimetal, the shorter the time it takes to trip the breaker. Short circuit protection is also provided magnetically, that is, a high level of current trips the breaker instantaneously. The lower limit of the magnetic trip setting is determined by the manufacturer such that the device does not nuisance trip on high inrush loads.

It has been estimated that a large percentage of the fires that occur in residential dwellings can be attributed to "arcing faults." An arc fault is an unintentional electrical discharge characterized by low and erratic current that may ignite combustible materials. Three types of arc faults common to household wiring are parallel, ground, and series. A parallel fault occurs when there is an arc resulting from direct contact of two wires of opposite polarity. A ground fault results when there is an arc between a wire and ground, and a series fault occurs when there is an arc across a break in a single conductor. Arcing can occur and lead to fire in these common situations: frayed appliance extension cords, pierced insulation on electrical construction wire, overheated cords or wires, and appliances where the insulation of the internal wires is impaired. These situations are outside of the normal protection provided by existing circuit breakers.

To address this particular type of problem, industry has developed the Arc Fault Circuit Interrupter (AFCI). AFCI technology was first used to protect the areas surrounding downed utility lines. Advances in electronic technology make arc fault protection available in residential circuits in a cost effective manner. The AFCI adds electronic protection to the "standard" thermal and magnetic protection provided by today's breakers. The arc-fault detection circuitry detects specific arcs that are determined to be likely to cause a fire. The AFCI uses electronics to recognize the current and voltage characteristics of the arcing faults, and interrupts the circuit when the fault occurs.

Another technology developed to address the increasing number of injuries caused from electrical faults is called Ground Fault Circuit Interrupter (GFCI). A GFCI is an inexpensive electrical device that, according to one report, if installed in household branch circuits, could prevent over two-thirds of the approximately 300 electrocutions and thousands of electrical shocks and burns occurring each year in and around the home. The GFCI measures the current flowing through the hot wire and the neutral wire. If the current differs by more than a few milliamps, the presumption is that current is leaking to ground via some other path. This may be because of a short circuit to the chassis of an appliance, or to the ground lead, or through a person. Any of these situations is hazardous, so the GFCI trips, breaking the circuit.

A circuit breaker with both AFCI and GFCI attributes provides a more comprehensive electrical protection solution. For example, GFCIs protect people from injury due to electrical shock using thermal and magnetic protection circuits by tripping the breaker circuit when the leakage to ground exceeds approximately 6 mA. The GFCI can detect phase-to-ground arcs, but cannot detect series arcs or parallel (line-to-neutral) arcs. Since the AFCI can detect both series and parallel arcs, it enhances the protection of the circuit. Operation of an AFCI breaker is described in related U.S. Pat. No. 5,875,087 issued to the assignee of the present application, and incorporated by reference in its entirety herein. AFCI does not replace the function of a GFCI, but it does provide enhanced protection from arcing conditions that may cause a fire. Circuit breakers with both AFCI and GFCI technology require two current sensors. Usually these current sensors are toroidal transformers. The GFCI requires a sensor with very high common mode rejection so only a small differential current produces an output. The toroidal transformer is a good way to achieve this performance.

On the other hand, AFCI circuitry requires a sample of the output current that is proportional to the load current. A toroidal transformer small enough for use in molded-case circuit breakers cannot handle the entire load current without saturating. This is because, after the transformer core saturates, the output characteristics of the transformer are no longer linear in nature. One way to reduce this problem is to use a transformer core with a small air gap. The presence of the air gap greatly reduces the inductance, and consequently the low-frequency cutoff is much higher. However, this adds some cost to the transformer, and since its output characteristics are a derivative of the input current (approximately 6 db/octave in the range of power line frequencies), the resulting signal is more difficult to process.

Circuit breaker testing is another process that must be performed to ensure reliable and safe devices are shipped to the consumer. Production line testing of circuit breakers having both arc fault and ground fault detection circuitry typically requires full-load currents and voltages with complex waveforms to ensure that the desired fault scenarios have been tested. The mere presence of these injurious currents and voltages demands that various precautions with respect to safety and equipment design be enforced to minimize the risk of injury. What is needed is a method for testing AFCI/GFCI circuit breakers during production using low voltages and currents which adequately test the full-load fault conditions of the device.

SUMMARY OF THE INVENTION

The invention disclosed and claimed herein provides a solution to reduce the problem of core saturation associated with toroid core transformers used as current sensors. Current sensing transformers may be equipped with a novel shunt conductor modification to the primary wiring of the transformer, called a Blanton Shunt (hereinafter called the B-Shunt). The B-Shunt is a conductor connected in parallel with one of the mains conductors, i.e., across the primary winding of the current sensing toroid core so that the B-Shunt does not pass through the core. The B-Shunt diverts a small portion of the mains conductor load current, which diverted current causes a slight imbalance in the net flux sensed by the transformer. A microprocessor detects this imbalance and outputs a control signal, which may be used to operate a circuit breaker according to predetermined criteria stored therein. The B-Shunt may be implemented using a relatively simple manufacturing process and provides a linear output from the transformer over wide variations in the load current.

In another aspect of the invention, only the shunt conductor is extended though the toroid transformer to provide similar results.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION CURRENT SENSOR

Figure 1:
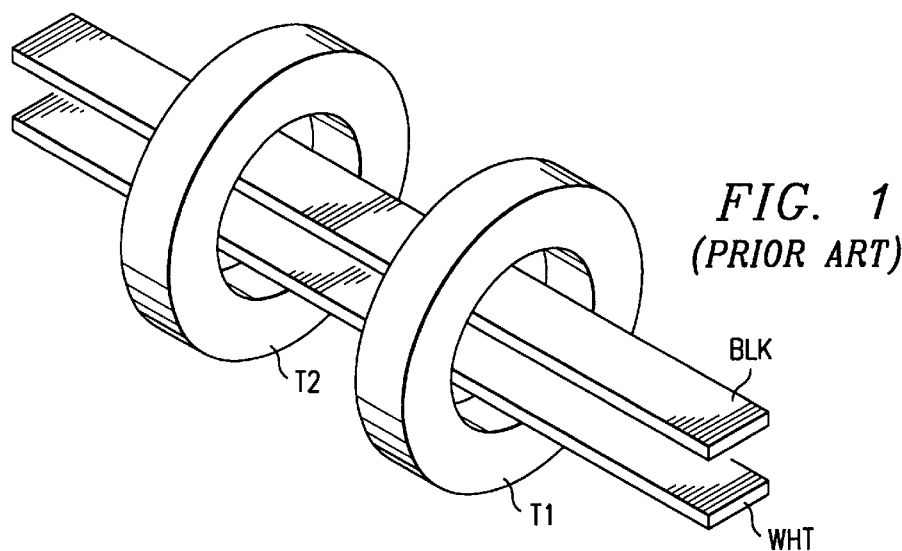
FIG. 1 illustrates a conventional GFCI sensor configuration where both conductors pass through a pair of toroidal cores.

Referring now to FIG. 1, there is illustrated a conventional ground fault circuit interrupter (GFCI) sensor configuration. Conventional GFCI circuit breakers are routinely manufactured with two heavy current-carrying mains conductors (BLK and WHT) passing through twin toroidal cores (of transformers T1 and T2). Although twin toroid transformers may be present, only one is used for the GFCI function. Transformer T1 detects leakage current in the GFCI mode, and has a turns ratio of approximately 1:1000. Transformer T2 detects a neutral-to-ground short and typically has a turns ratio of approximately 1:200.

Figure 2:
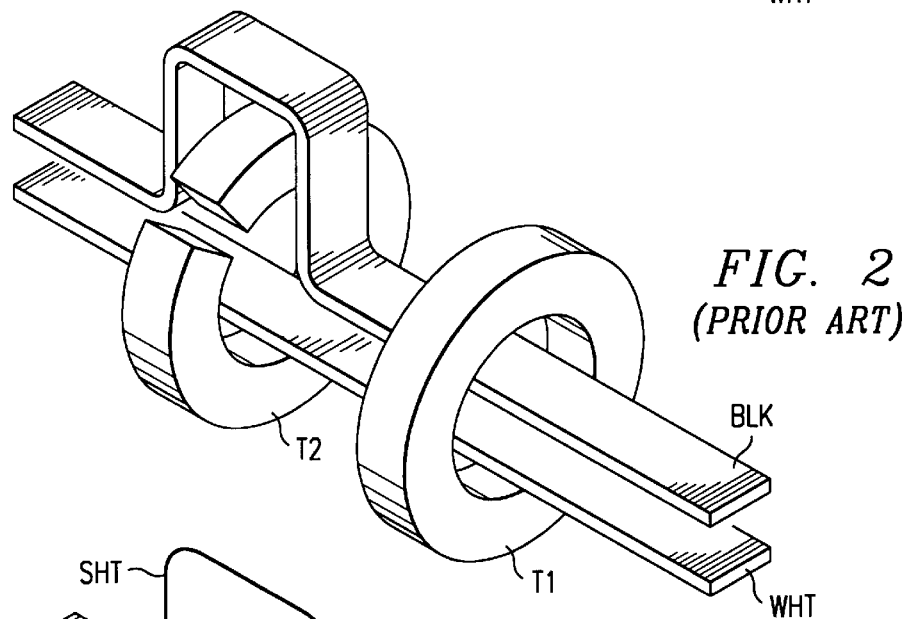
FIG. 2 illustrates a conventional AFCI/GFCI sensor configuration where one conductor loops around a toroid with an air gap.

Referring now to FIG. 2, there is illustrated a conventional AFCI/GFCI sensor configuration where one mains conductor does not pass through the toroid core, the toroid core having an air gap. The transformer T2 uses an air gap to prevent saturation at high currents. However, the lower signal output and narrower bandwidth (since the low frequency cutoff rises) in effect provides a differentiation function, which requires an extra stage at the detection process to integrate the detected signal.

Figure 3:
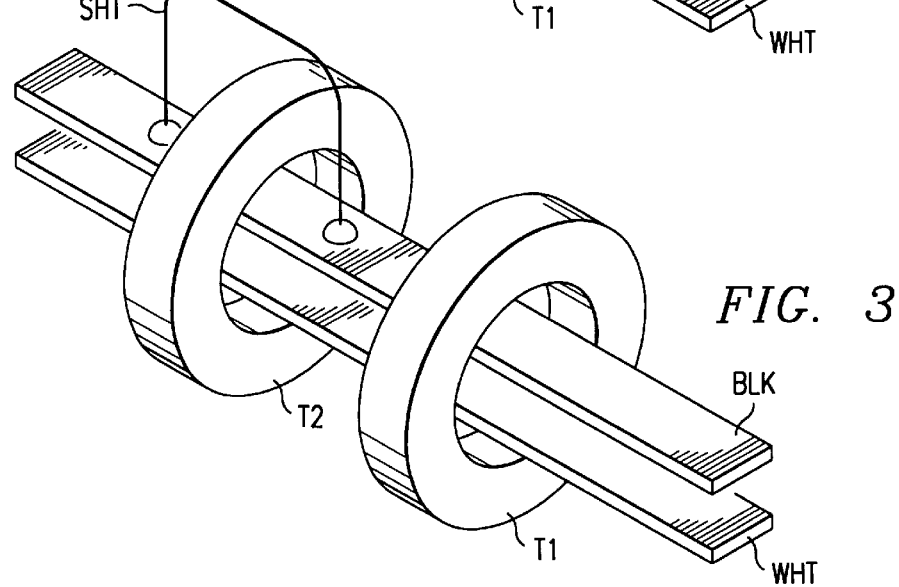
FIG. 3 illustrates a AFCI/GFCI sensor configuration having a B-Shunt, according to the disclosed embodiment.

Referring now to FIG. 3, there is illustrated a simple, but novel, modification to one of the current sensing transformers of FIG. 1. An improved current sensor is provided with the addition of the small gauge shunt conductor SHT (also called a B-Shunt) which is connected to one mains conductor to divert a small fraction of the current flowing in that mains conductor away from the load sensing transformer T2. The shunt conductor may be connected either to the hot wire (conductor BLK) or alternatively, to the neutral wire (conductor WHT), whichever is being tapped. The resistance in the shunt is greater than the resistance in either of the mains conductors (BLK and WHT), and therefore only a small amount of current is shunted around the toroid core. This small resistance shunt causes an imbalance of the currents in the conductors (BLK and WHT) through transformer T2 that is directly proportional to the load current. Therefore, the output of shunted current sensor is proportional to the load current. This unbalancing current flowing through the shunt conductor SHT is determined by the resistance ratio of the B-Shunt resistance to the resistance of the conductor to which it is attached, and may normally be substantially less than half of the current flowing in the load conductor. In the illustrative embodiment described herein, the shunt current typically may be on the order of 2–3% of the current flowing to the load. For example, where the transformer T2 has a turns ratio of approximately 1:1000, and the load current is 100 amps, there may be 2–3 amps flowing in the B-Shunt, and the current in the secondary SEC of transformer T2 is then approximately 2–3 mA. This current is then converted to a proportional voltage by a terminating resistor from which a detection circuit reads the voltage. Therefore, this small fraction of diverted current provides a nearly linear and scaled-down, proportional sample from the net flux in the core of the transformer T2.

The shunt conductor SHT is approximately a 30–32 gauge copper wire and may be connected by some commonly known means (e.g., spot welded) to one of the mains conductors (BLK or WHT). Although the addition of this particular type of shunt conductor SHT may require an extra process step to spot weld each end of the shunt conductor SHT to one of the heavy mains conductors (BLK or WHT), the shunt conductor SHT can be made small since it is not required to carry a large amount of current. Therefore, the whole shunted current sensor assembly may be more compact than the configuration offered in FIG. 2.

Some benefits realized by the disclosed current sensing transformer embodiment are: the B-Shunt can be made from a small conductor since it does not carry high current; the shunted current sensor is easy to manufacture, since one of the conductors that carries a large current does not have to be bent in a complicated way to bypass transformer T2; and, the net flux flowing through transformer T2 is low enough such that the current sensed is nearly linear over a wide range of load currents.

Figure 4A:
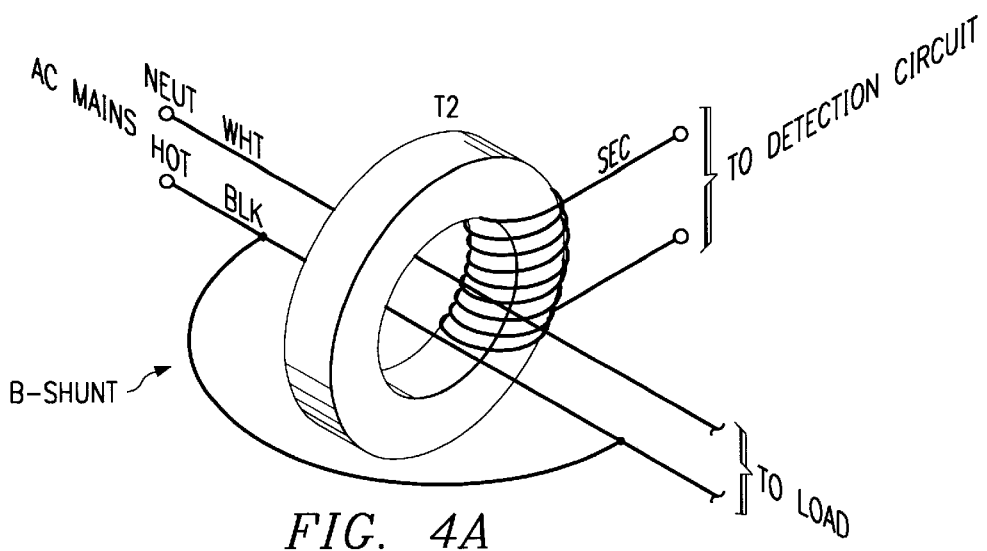
FIGS. 4A and 4B illustrate a physical implementation of a current sensor using a toroid transformer with the B-Shunt, and an equivalent circuit representation thereof, respectively.

Referring now to FIG. 4A, there is illustrated an arc fault detection sensor implementation. A pair of mains conductors (BLK and WHT) provide a forward and return path for current to a load. A single magnetic core (made of materials commonly known) provides the basis for a toroid transformer T2 which has both the mains conductors (BLK and WHT) extending therethrough. The B-Shunt conductor attaches at the first end to the hot conductor BLK and loops outside the magnetic core to bypass the toroid transformer T2 (and does not extend therethrough). The other end of the B-Shunt attaches again to the same conductor to which the first end is attached (in this case, conductor BLK). This connection electrically places the B-Shunt across the primary winding of the transformer T2. In this particular embodiment, a secondary winding SEC has approximately 1000 turns, and which according to the turns ratio couples a small sample of the load current to a detection circuit. It will be appreciated that, although this embodiment utilizes approximately 1000 turns for the secondary winding, the turns ratio is not that critical to overall operation of the arc fault detection function of the circuit breaker, and may be varied well above or below the 1000 turns used in this illustrative embodiment, according to preferred design considerations and economic considerations. The detection circuit, mentioned in greater detail hereinbelow, reads the sampled load current from across a detection resistor to process the sample parameter and operate the circuit breaker accordingly.

Figure 4B:
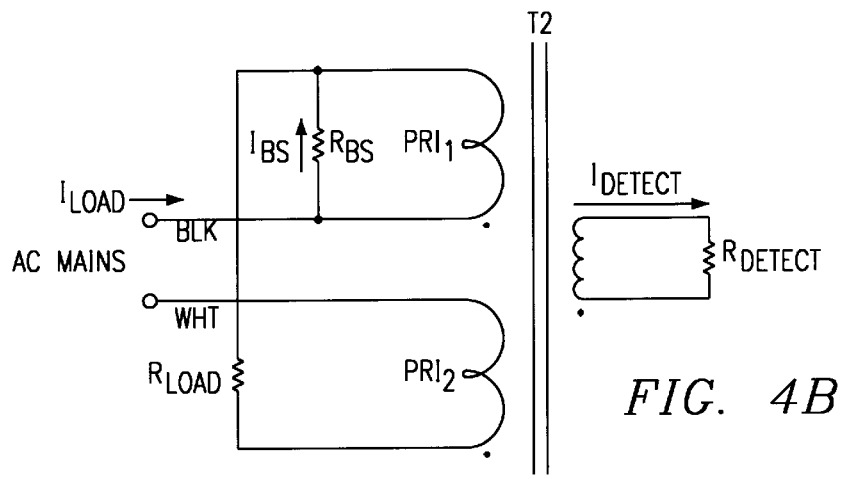

Referring now to FIG. 4B, there is illustrated a schematic diagram of a current sensing transformer according to the disclosed embodiment. There is shown a current sensing transformer T2 comprising twin primary windings ($PRI_1$ and $PRI_2$) and a secondary winding SEC, each wound on a magnetic toroidal core. The first primary winding $PRI_1$ consists of a single turn of the hot mains conductor and the second primary winding $PRI_2$ consists of a single turn of the neutral conductor. The B-Shunt, in the exemplary embodiment, comprises a small gauge wire, and is shown as a small shunt resistance $R_{BS}$ (typically on the order of 50 mΩ) connected to the hot conductor BLK and across the primary winding $PRI_1$. (The resistance value of the B-Shunt may vary considerably from the disclosed 50 mΩ according to the desired detection circuit designs.) Connected across the secondary winding SEC is a resistance $R_{DETECT}$ whose voltage is sampled by the detection circuitry (a function provided by a microprocessor control circuit mentioned hereinbelow). With this shunt resistance $R_{BS}$ in place, the load current $I_{LOAD}$ flowing in one conductor (the hot conductor BLK, in this particular embodiment) divides into two paths. Therefore, the current $I_{BS}$ through the shunt resistance $R_{BS}$ is only a small fraction of the total load current $I_{LOAD}$, perhaps on the order of 2% in this example. The net flux in transformer T2 is a function of the net current $I_{NET}$ defined in terms of the current in the hot conductor $I_{BLK}$ (which is also the load current $I_{LOAD}$), current in the neutral conductor $I_{WHT}$ and current flowing through the B-Shunt $I_{BS}$, where:

$$I_{NET}=(I_{BLK}-I_{BS})-I_{WHT}.$$

Since the net flux in transformer T2 is typically only about 2% of the load current $I_{LOAD}$, the transformer T2 core doesn't saturate, and the output of transformer T2 is a nearly linear signal proportional to the load current $I_{LOAD}$. Therefore, a sample of the load current $I_{LOAD}$ (shunt current $I_{BS}$) is coupled to the secondary SEC of transformer T2 according to the turns ratio. This secondary SEC load sample current $I_{DETECT}$ is then detected by the microprocessor control circuit across a resistance $R_{DETECT}$. This shunt conductor SHT can be connected to either the black BLK or the white WHT conductor with the same effect. Additionally, the phase of the transformer output can be changed simply by reversing the connections to the secondary winding SEC.

Figure 5:
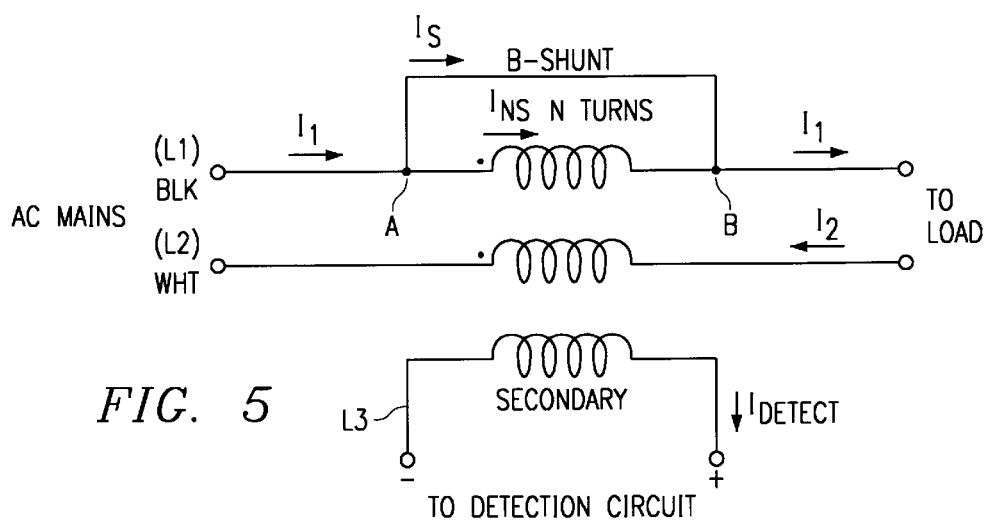
FIG. 5 illustrates an alternative embodiment wherein a magnetic core is not required.

Referring now to FIG. 5, there is illustrated an alternative embodiment wherein a coreless (a core lacking magnetic material) current transformer coil L3 provides the coupling to the detection circuit. In this particular example, two conductors (L1 and L2, and also called BLK and WHT, respectively) provide the forward and return paths, respectively, for load current carried between an AC mains source and a load. A third conductor L3 is coiled around the two conductors (L1 and L2) forming coil L3 having a number of turns N to couple any current differential detected between the two conductors (L1 and L2) to a detection circuit. The B-Shunt bypasses the coil L3 by connecting external to the coil L3 between Nodes A and B on the hot conductor L1. The load current $I_1$ on the hot conductor L1 reaches Node A and splits according to the resistance of the B-Shunt relative to the resistance of the hot conductor L1. As mentioned hereinabove, the resistance of the B-Shunt conductor is typically very small (on the order of 50 mΩ), yet large relative to the resistance of the conductor to which it is attached. Therefore, only a very small portion of the load current is diverted through the B-Shunt. The shunt current $I_S$ passes through the B-Shunt, and the remaining unshunted current $I_{US}$ passes through the hot conductor L1 to Node B where the currents recombine to the load. To represent the current in the secondary of the coreless transformer, $$I_{DETECT}=(I_1-I_{US})/N,$$

where $I_1=I_2=I_S+I_{US}$; $I_S=I_1/r$; N=number of turns of conductor L3; and $r=R_{BS}/R_{AB}$, where $R_{BS}$ is the resistance of the B-Shunt between Nodes A and B, and $R_{AB}$ is the resistance of the conductor L1 between Nodes A and B. It can appreciated that the coil L3 may be more easily formed around a non-magnetic material such as plastic for manufacturing and installation purposes.

Figure 6A:
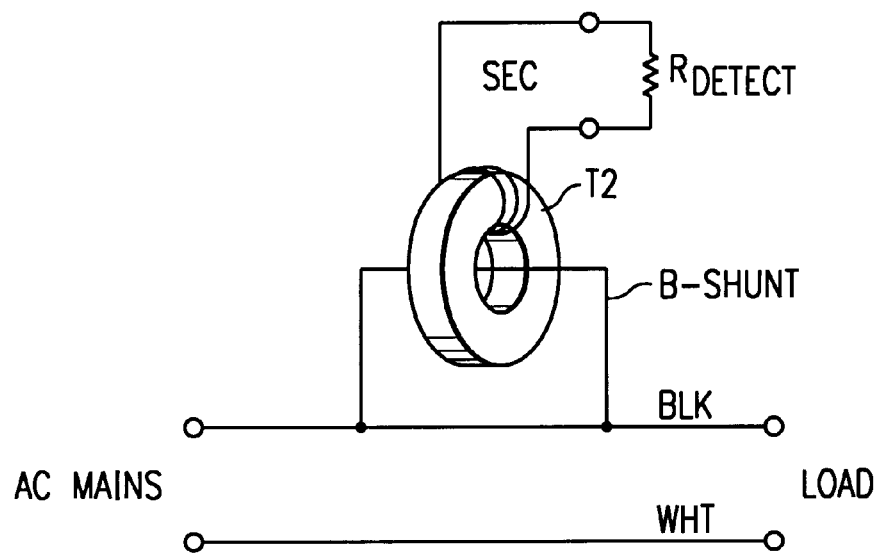
FIGS. 6A and 6B illustrate an alternative embodiment where the B-Shunt alone is passed through the current sensor transformer core.

Referring now to FIG. 6A, there is illustrated an alternative embodiment using the B-Shunt. As can be differentiated from FIGS. 4A and 5, in this particular embodiment, the AC mains conductors (BLK and WHT) do not pass through the toroid core. Instead, the B-Shunt passes through the toroid core. As mentioned hereinabove, the B-Shunt may also be applied to the neutral conductor WHT to obtain similar results. The transformer T2 has a secondary winding SEC across which is connected a detect resistance $R_{DETECT}$. A control circuit detects the voltage across this resistance and responds according to programmed instructions. This configuration offers the option of locating the transformer T2 away from transformer T1 (if T1 is provided in the particular circuit breaker), which may provide a more cost effective manufacturing approach. Since the mains conductors (BLK and WHT) are not passed through the toroid core (the manufacturing processes perhaps no longer driving the location of the transformer T2), the transformer T2 can be placed in a more space-accommodating location on, for example, a circuit board which may be used in the circuit breaker.

Figure 6B:
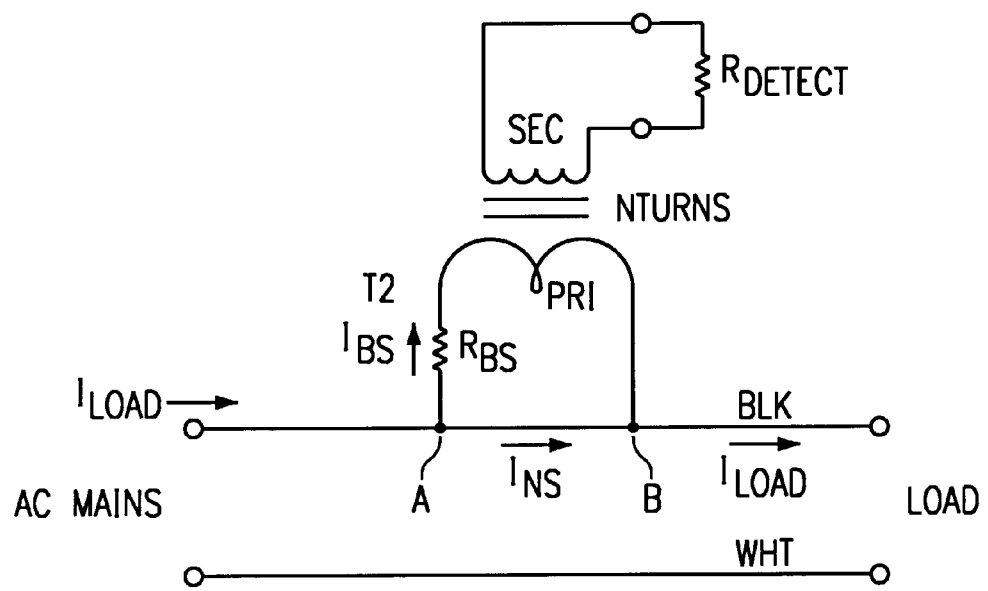

Referring now to FIG. 6B, there is illustrated an electrical circuit representation of the physical circuit of FIG. 6A. The B-Shunt resistance $R_{BS}$ is shown in series with a single-turn primary PRI. The load current $I_{LOAD}$ splits into the B-Shunt current $I_{BS}$ and the unshunted load current $I_{US}$ at Node A. Again, as mentioned hereinabove, the amount of current diverted through the B-Shunt is in proportion to the resistance of the B-Shunt $R_{BS}$ and the conductor BLK resistance between Nodes A and B. Typically, the B-Shunt resistance is very small, but larger relative to the conductor BLK resistance between Nodes A and B. The turns ratio N from the primary PRI to the secondary SEC can be varied according to design needs, and is not a critical aspect.

It can be appreciated that the implementation disclosed in FIG. 5 may be applied to the configuration of FIG. 6A, wherein a coreless winding may be used to couple the shunted current to the detection circuit.

Figure 7:
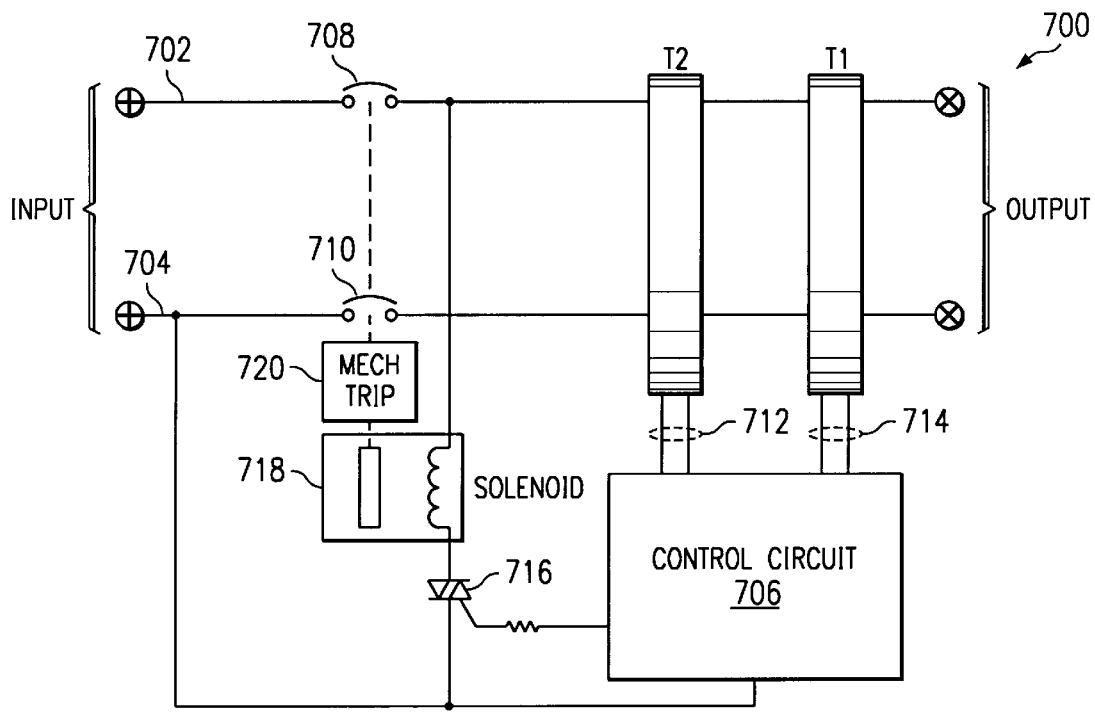
FIG. 7 illustrates a conventional AFCI/GFCI circuit breaker.

Referring now to FIG. 7, there is illustrated a conventional AFCI/GFCI circuit breaker. The circuit beaker 700 is built according to known electrical standards and houses two toroidal transformers, a transformer T1 for sensing leakage current between the hot lead and ground in ground fault protection mode, and a transformer T2 for use in sensing current in the arc fault detection mode. The net current through transformer T1 is zero unless there is a leakage path to ground. Mains conductors 702 and 704 (hot and neutral) receive source power from an AC mains and pass through transformers T1 and T2 so that a portion of the current may be monitored by a control circuit 706. Breaking elements 708 and 710 provide a method for breaking the circuit between the input and the output (the load) of the circuit breaker 700. Winding connections 712 and 714 from transformers T2 and T1, respectively, carry current sense signal to the control circuitry 706 in order for control circuitry 706 to react thereto and trip the breaker 700, if necessary. The control circuit 706 controls the gate current to a triac 716, and in overcurrent, leakage or arcing conditions, turns on the triac 716 in order to activate a solenoid 718 to trip the breaker 700. A mechanical trip switch 720 is included to allow manual tripping of the circuit breaker 700. The solenoid 718 also connects to activate the mechanical trip switch 720 such that the circuit breaker 700 is tripped when overcurrent, leakage or arcing conditions trigger the control circuit 706 to turn on the triac 716 and pull in the solenoid 718 to engage the mechanical trip switch 720.

Figure 8:
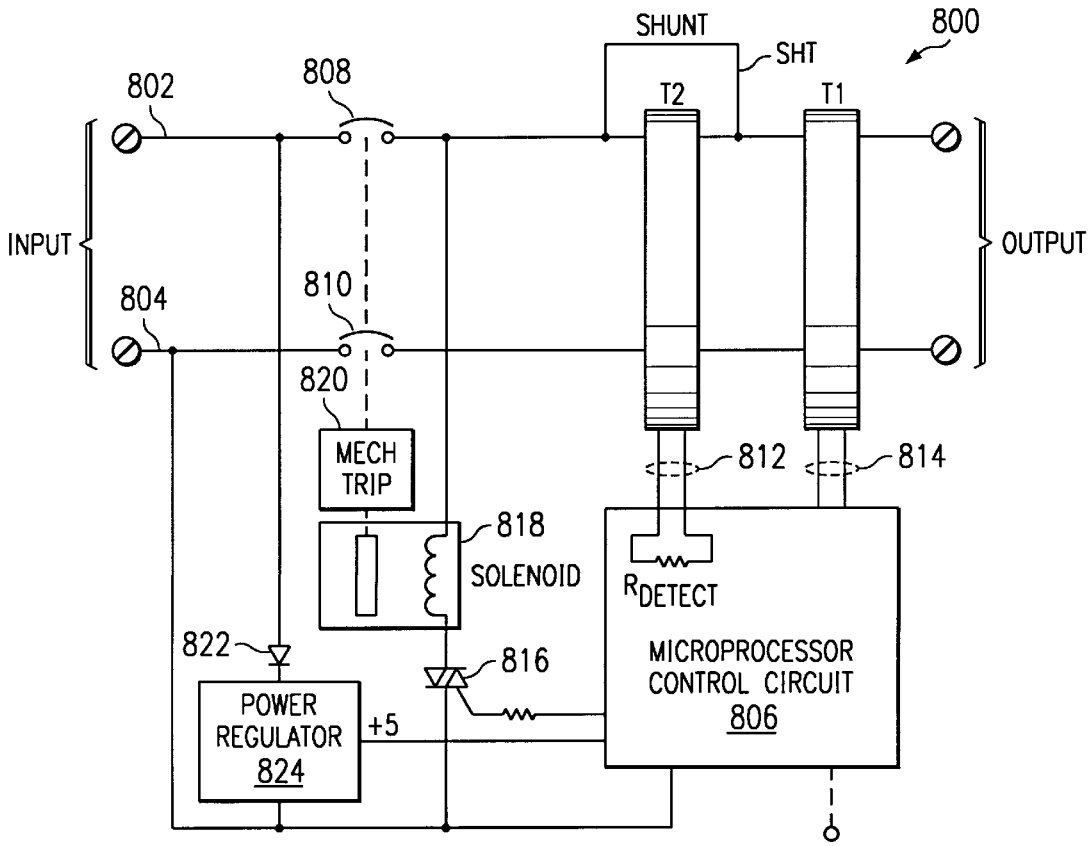
FIG. 8 illustrates an AFCI/GFCI circuit breaker having a current sensor according to the disclosed embodiment.

Referring now to FIG. 8, there is illustrated an AFCI/GFCI circuit breaker which uses the current sensor according to the disclosed embodiment. The circuit beaker 800 is built according to known electrical standards and houses two toroidal transformers, a transformer T1 for sensing leakage current between the hot lead and ground in ground fault protection mode, and a transformer T2 for sensing current in the arc fault detection mode. (Both transformers T1 and T2 are similar to those of FIG. 7.) Mains conductors 802 and 804 (hot and neutral, respectively) connect to receive source power from an AC mains and pass through transformers T1 and T2 so that a portion of the current may be monitored by a processor control circuit 806. The output of transformer T1 is amplified, and this amplifier has a linear output for up to approximately 25 mA of differential current between mains conductors 802 and 804. The net current through transformer T1 is zero unless there is a leakage path to ground.

Turning now to the arc fault detection circuit which uses transformer T2, a voltage $V_{DETECT}$ across a detect resistance $R_{DETECT}$ at the output of transformer T2 (at the secondary winding SEC) is proportional to the current $I_{BS}$ through the B-Shunt SHT. The microprocessor control circuit 806 detects this voltage $V_{DETECT}$ and compares the voltage value with stored predetermined operating limits in order to determine whether to disengage the breaking elements 808 and 810 to trip the breaker 800, or to allow the circuit breaker 800 to maintain the connection from the AC source to the load for normal operation. This voltage $V_{DETECT}$ is in essence a differential representation between the current in the hot conductor $I_{BLK}$ and the current in the neutral conductor $I_{WHT}$. Operation of an AFCI breaker is described in related U.S. Pat. No. 5,875,087 issued to the assignee of the present application, and incorporated by reference in its entirety herein. The microprocessor control circuit 806 may also, optionally, have an I/O port interface for communicating with external systems. For example, the microprocessor control circuit 806 may be programmed during a testing mode to turn on and turn off certain functions, or may receive updated programming information via the I/O port interface.

Breaking elements 808 and 810 provide a method for breaking the circuit between the input and the output of the circuit breaker 800. Winding connections 812 and 814 from transformers T2 and T1, respectively, carry a current representative of the mains current to processor control circuitry 806 in order for processor control circuitry 806 to react thereto and trip the breaker 800, if necessary. The processor control circuit 806 also controls the gate current to the triac 816, and in overcurrent or arcing conditions, turns on the triac 816 in order to activate a solenoid 818 to trip the breaker 800. A mechanical trip switch 820 is included to allow manual tripping of the circuit breaker 800. The solenoid 818 also connects to activate the mechanical trip switch 820 such that overcurrent or arcing conditions trigger the control circuit 806 to turn on the triac 816 and pull in the solenoid 818 to engage the mechanical trip switch 820 and trip the circuit breaker 800. The processor control circuit 806 is powered by a power circuit comprising a diode 822 and regulator 824. The power circuit converts the AC mains voltage to a 5-volt DC output for powering the processor control circuit 806.

Test Circuit

Testing circuit breakers with arbitrary complex waveforms can be complicated because of the high peak power that is normally required in the test waveforms. Conventional circuit breakers require that 120 volts AC be present across the two power conductors to supply DC power for the ground and arc fault detection electronics, and to power the solenoid used to trip the circuit breaker in the event of a fault. If testing waveforms require even a few tens of amps, the circuitry to generate such high power is very large and very expensive.

The more troublesome aspect of circuit breakers having AFCI technology is testing the arc fault detection circuitry in the circuit breaker. For example, it is difficult to duplicate the complex waveforms comprising arc events at full load currents under testing conditions during manufacture. Such duplication requires large and complex equipment not readily adaptable to assembly line applications. What is needed is an accurate, low cost, and efficient method to simulate such high current arcing conditions in an assembled circuit breaker containing arc fault detection circuitry.

The solution is provided by employing a novel current sensing transformer with a B-Shunt in the arc fault detection circuitry of the circuit breaker in combination with an external, low power test waveform generator connected to one of the terminals of the circuit breaker. The B-Shunt introduces a tremendous simplification in the testing procedure.

Figure 9:
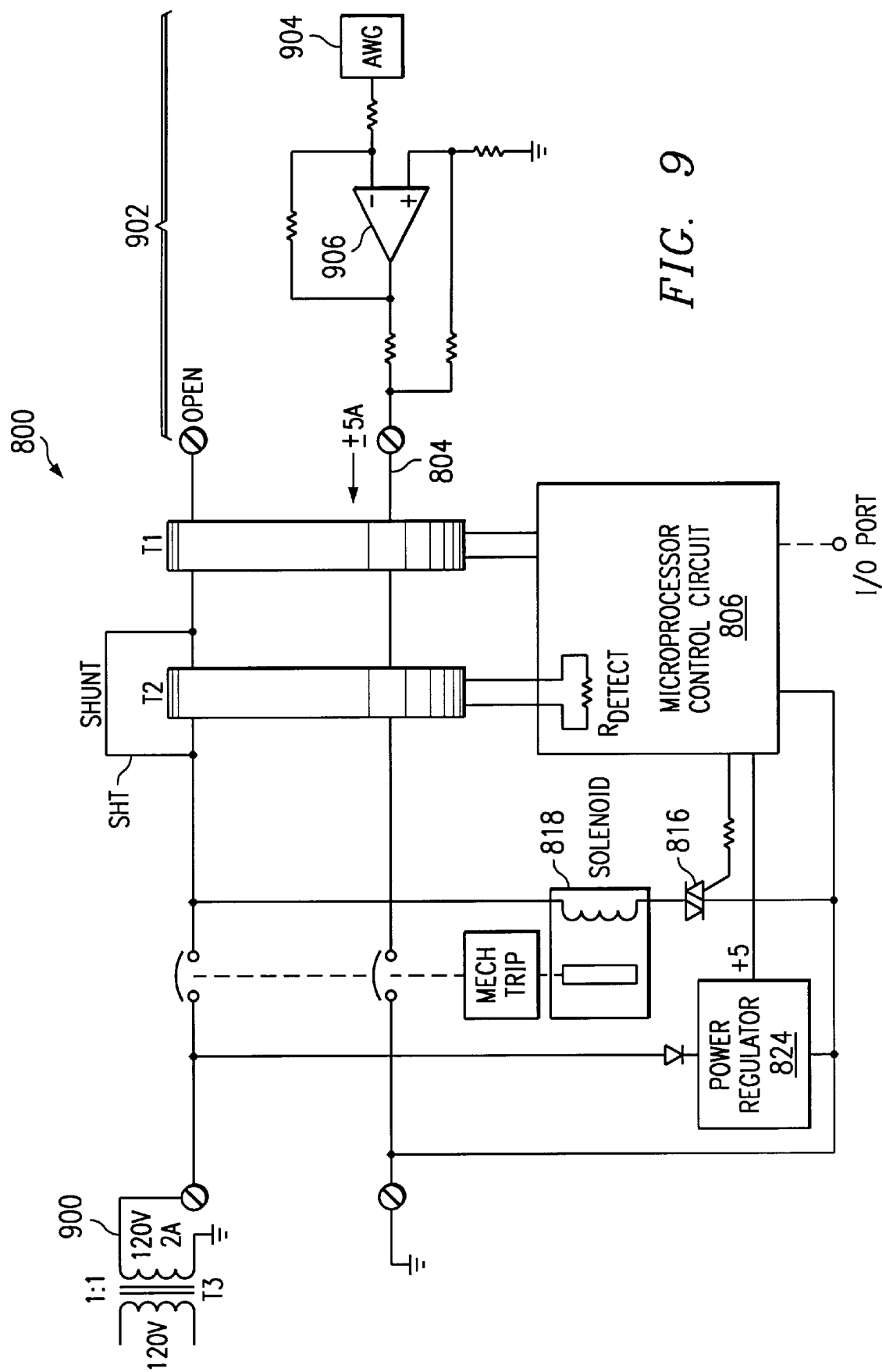
FIG. 9 illustrates a test configuration for testing the circuit breaker of FIG. 8 using the current sensor of the disclosed embodiment.

Referring now to FIG. 9, there is illustrated the circuit breaker of FIG. 8 in a low-power test configuration. The test configuration uses a transformer circuit 900 for powering the circuit breaker 800 during the test operation, and a signal generator circuit 902 for generating simulated arc detection waveforms. An arbitrary waveform generator (AWG) 904 is programmed to provide a variety of complex waveforms which simulate signals encountered by the breaker when in operation in the field. The output of the AWG 904 is input to a medium power amplifier 906 which programs the test waveforms with a high bit resolution and a bandwidth that covers the range of frequencies which the electronic circuitry in the arc detection mode will be detecting. The signal generation circuit 902 comprises, for example, an APEX model PA02 medium power amplifier 906 which outputs a low voltage bipolar 5 A signal to the neutral conductor 804. During the test of the arc fault detection circuitry, the output of the AWG 904 sends both a bit pattern to disable the ground fault circuit interrupting function (which uses transformer T1), and a test waveform which is a small replica of a full-scale load current arc fault. As mentioned hereinabove, the test waveform is sent at a low voltage level and a relatively low current level down one of the mains conductors (the neutral conductor 804, in this case) passing through the pair of toroid transformers T1 and T2. It will be appreciated that this test may be performed on a fully assembled circuit breaker 800 with the built-in power transformer (T3) and both toroid transformers (T1 and T2) in place. (Thus one does not have to disassemble the circuit breaker 800 in order to provide this testing.) The special configuration of the circuit breaker 800 using transformer T2 with the B-Shunt allows low-voltage testing of the microprocessor control circuit 806 detection and trip functions through the injection of low current, low voltage complex waveforms which are representative of high load current arcing conditions.

The transformer circuit 900 comprises a 120 VAC isolation transformer T3 which supplies power to line terminal 802 for the electronic circuits in the circuit breaker 800 including the solenoid 818 used to trip the circuit breaker 800, the power regulator 824, and the microprocessor control circuit 806. Neutral terminal 804 is connected to ground. The transformer T3, in this particular embodiment, has a turns ratio of approximately 1:1 with a 120 VAC/2A secondary winding power capability. (If desired, the voltage can be reduced to approximately 50–60 VAC for worst-case testing of the solenoid's ability to trip the breaker.) In any case, this power does not have to be turned on and off in a complex way, therefore a simple triac switch 816 can be used in the test setup. Although the average power supplied by the transformer T3 is very small, it does have to provide approximately two amperes when the solenoid 818 is energized. It will be appreciated that a transformer T3 whose power specifications are too low might cause a large voltage glitch that would disturb the microprocessor control circuit 806 in the circuit breaker 800.

One of the conditions that must be accommodated while testing the current and arcing response of the circuit breaker 800 that has both the ground and arc fault detection capabilities is that the ground fault detection circuitry connected to its sensing transformer T1 will sense the very large imbalance in current flowing through that transformer T1. This large imbalance would normally be more than enough to cause the circuit breaker 800 to trip during testing due to a suspected ground fault. However, the ground fault circuit interrupting function can be easily disabled by programming a low level current of approximately 3 mA in a coded sequence and inserting the coded signal onto the mains conductor 804. The coded signal is then detected by the program in the microprocessor control circuit 806 in the circuit breaker 800. This allows the microprocessor control circuit 806 to disable the ground fault circuit interrupting function long enough to perform the high current test of the arc detection circuitry in the circuit breaker 800. For example, a 16-bit code pattern can be output in less than 300 milliseconds prior to each high current test. As mentioned hereinabove, if available, the I/O port of the microprocessor control circuit 806 may also be employed to momentarily disable the ground fault detection features during the testing phase.

A typical binary output pattern from the test waveform generator might be on the order of 1100 0100 0110 1011. This particular pattern has an equal number of 1's and 0's to eliminate offset effects caused by AC coupling of the ground fault circuit sensing transformer T1. Each "1" is encoded as a complete AC cycle with an amplitude of 3 mA. Correspondingly, each "0" is encoded as an interval of one cycle with zero current. The software overhead for this function is quite small and adds no cost to the completed circuit breaker 800. This technique is used to put the internal program of the microprocessor control circuit 806 into a special diagnostic mode when testing the arc fault and ground fault modes of the circuit breaker.

It should be appreciated that although the illustrative embodiments of the current sensor of the disclosed embodiment are disclosed for operation at power line frequencies, the current sensor of the disclosed embodiment may in principle also be employed in high frequency regimes.

Although the preferred embodiment has been described in detail, it should be understood that various changes, substitutions and alterations can be made therein without departing from the spirit and scope of the invention as defined by the appended claims.

What is claimed is:

1. A test circuit for testing a circuit breaker, comprising:
   a circuit breaker, including:
   at least first and second conductors for carrying load current between a source and a load, and having at least one series breaking element for interrupting the flow of said load current,
   at least a first current sensor having an output coupled to said circuit breaker, wherein said at least first and second conductors are coupled to said current sensor for sensing the net current of said load current carried on said at least first and second conductors,
   wherein said current sensor further includes a shunt connected at each end to said first conductor for bypassing a small portion of said load current around said current sensor to unbalance the net flux producing an output of said current sensor, thereby increasing the detection sensitivity of said current sensor to a test current coupled in series with one of said first and second conductors, and
   a control circuit for detecting said test current, and providing an indication responsive to said test current; and
   a waveform generator circuit connected to said one of said first and second conductors for injecting a waveform including said test current into one of said conductors during a test operation wherein the other of said first and second mains conductors is open circuited.

2. The test circuit of claim 1, wherein said circuit breaker comprises both arc fault and ground fault detection circuitry.

3. The test circuit of claim 1, wherein said waveform includes both a bit pattern and a test current for testing said arc fault detection circuitry output from said waveform generator circuitry, and wherein said test current is a smaller replica of a load current arc fault.

4. The test circuit of claim 3, wherein said bit pattern instructs said control circuit to disable said ground fault detection circuitry of said circuit breaker during testing of said arc fault detection circuitry.

5. The test circuit of claim 3, wherein said waveform is of a low voltage and current which is injected into one of said at least first and second conductors during said test operation.

6. The test circuit of claim 5, wherein said waveform is injected into a neutral conductor.

7. The test circuit of claim 1, wherein said control circuit processes said test current by comparing said test current with predetermined limits, and provides an indication responsive to said test current being outside said predetermined limits.

8. The test circuit of claim 1, wherein said current sensor is a toroid core transformer wherein said first and second conductors pass through said toroid core.

9. The test circuit of claim 1, wherein said first current sensor is a coreless transformer having N turns.

10. The test circuit of claim 1, wherein said first current sensor has only said third conductor extending therethrough.

11. The test circuit of claim 10, wherein said first current sensor is a toroid core transformer.

12. The test circuit of claim 1, wherein said first current sensor is a coreless transformer having N turns.

13. A method of testing a circuit breaker, comprising the steps of:
    providing a circuit breaker coupled to at least first and second conductors for carrying load current between a source and a load, and having at least one series breaking element for interrupting the flow of current to the load;
    providing at least a first current sensor having an output coupled to the circuit breaker, the at least first and second conductors being coupled to the first current sensor for sensing the net current carried on the at least first and second conductors;
    including in the first current sensor a shunt connected at each end to the first conductor for bypassing a small portion of the load current around the first current sensor to unbalance the net flux producing an output of the current sensor, thereby increasing the detection sensitivity of the current sensor to a test current coupled in series with one of the first and second conductors;
    injecting from a waveform generator connected to the one of the first and second conductors a waveform including a test current into one of the first and second conductors during a test operation wherein the other of the one of the first and second mains conductors is open circuited;
    detecting the test current with a control circuit; and
    providing an indication responsive to the test current.

14. The method of claim 13, wherein the step of providing a circuit breaker comprises the step of:
    providing a circuit breaker having both arc fault detection and ground fault detection circuitry.

15. The method of claim 13, wherein the step of injecting comprises the step of:
    outputting from the waveform generator both a bit pattern and a test current for testing the arc fault detection circuitry, and wherein the test current is a smaller replica of a load current arc fault.

16. The method of claim 15, wherein the step of outputting comprises the step of:
    disabling the ground fault detection circuitry responsive to the bit pattern, of the circuit breaker during testing of the arc fault detection circuitry.

17. The method of claim 13, wherein the step of injecting comprises the step of:
    injecting a test current into one of the first and second conductors which test current has a voltage and current which is substantially less than the load voltage and current during normal operation.

18. The method of claim 17, wherein the step of injecting comprises the step of:
    injecting the test current into a neutral conductor.

19. The method of claim 13, wherein the step of providing an indication comprises the steps of:
    comparing the test current detected in the step of detecting with predetermined limits; and
    tripping the breaking elements in response to the test current being outside the predetermined limits.

20. The method of claim 13, wherein the step of providing at least a first current sensor comprises the step of:
    providing a toroid core transformer wherein the first and second conductors pass through the toroid core.

21. The method of claim 13, wherein the step of:
    providing at least a first current sensor comprises the step of providing a coreless transformer having a secondary winding having N turns.

22. The method of claim 13, wherein the step of:
    providing at least a first current sensor comprises the step of providing only the shunt extending therethrough.

23. The method of claim 22, wherein the step of:
    providing at least a first current sensor comprises the step of providing a toroid core transformer.

24. The method of claim 22, wherein the step of:
    providing at least a first current sensor comprises the step of providing a coreless transformer having a secondary winding having N turns.

25. A test circuit for testing a circuit breaker, comprising:
    a circuit breaker under test, said circuit breaker including:
        first and second mains conductors coupleable to a power line;
        a control circuit for operating the circuit breaker in the presence of a fault current in said mains conductors; wherein
        said control circuit is operatively responsive to a shunted current sensor coupled to said mains conductors wherein a shunt portion of said shunted current sensor is coupled at each end to a select one of said mains conductors and bypasses only a small fraction of current flowing in said select one of said mains conductors;
    a waveform generator for injecting a test signal in series with one of said mains conductors wherein said test signal includes a smaller replica of an expected actual fault current; and
    a power source for supplying operating voltages to said circuit breaker.

26. The circuit of claim 25, wherein said circuit breaker comprises:
    separable contacts in at least one of said first and second mains conductors; and
    an indicator operatively responsive to the presence of said fault current.

27. The circuit of claim 25, wherein said shunted current sensor comprises:
    a transformer having a toroid core and an output from a secondary winding thereof coupled to an input to said control circuit wherein said first and second mains conductors pass through said toroid core; and
    a shunt conductor connected at each end to one of said mains conductors for unbalancing the net flux in said toroid core.

28. The circuit of claim 25, wherein said waveform generator comprises:
    a source of said test signal providing reduced amplitude replicas of current waveforms representing full load arcing events; and an amplifier for receiving said test signal from said source and coupling said test signal to said one of said mains conductors.

29. The circuit of claim 25, wherein said waveform generator comprises:

a source of a coded signal having embedded therein a command instruction; and a coupling circuit for including said coded signal with said test signal.

30. The circuit of claim 29, wherein said command instruction comprises:

information for preconfiguring said control circuit to disable a ground fault sensing circuit therein during a period when said test signal is injected into one of said mains conductors.

31. A circuit for testing an electronic circuit breaker having line and neutral conductors coupleable in series with the line and neutral conductors of a power line and having a control circuit for operating separable contacts in at least one of said line and neutral conductors, comprising:

a differential sensor responsive to currents flowing in said line and neutral conductors and having an output coupled to an input of said control circuit in said circuit breaker;

a power source coupled to said circuit breaker for providing operating voltages thereto; and a waveform interface circuit for coupling one or more test waveforms from a source external to said circuit breaker to one of said line and neutral conductors wherein a portion of a first one of said test waveforms coupled by said interface circuit includes a coded signal for preconfiguring said circuit breaker for testing.

32. The apparatus of claim 31, wherein said differential current sensor comprises:

a transformer located within said circuit breaker and having a toroid core and an output from a secondary winding thereof coupled to said input of said control circuit, wherein said line and neutral conductors pass through said toroid core.

33. The apparatus of claim 31, said electronic circuit breaker comprising:

line and neutral conductors;

a housing containing said separable contacts, said control circuit and said differential sensor; and connection means for coupling said line and neutral conductors of said power line to said line and neutral conductors respectively of said circuit breaker.

34. The apparatus of claim 31, wherein said waveform interface comprises:

a source of said test waveforms providing reduced amplitude replicas of current waveforms representing full load arcing events; and an amplifier for receiving said test waveform from said source and coupling said waveforms to said one of said line and neutral conductors.

35. The apparatus of claim 31, wherein said test waveforms are coupled to said neutral conductor.

36. The apparatus of claim 31, wherein said neutral conductor provides a summing point for a plurality of waveform interface circuits.

37. The apparatus of claim 35, wherein said plurality of waveform interface circuits each couple a component of a composite test waveform to said neutral conductor.

38. The apparatus of claim 31, wherein said waveform interface circuit provides a summing point for a plurality of components of a composite test waveform.

39. The apparatus of claim 31, wherein said coded signal comprises:

a coded sequence of waveform transitions; and a command instruction embedded in said coded sequence.

40. The apparatus of claim 38, wherein said coded sequence comprises:

a binary output pattern having a substantially minimum offset value.

41. The apparatus of claim 38, wherein said command instruction comprises:

a signal for disabling a ground fault detection function in said circuit breaker for a predetermined interval while a test waveform is coupled by said waveform interface.

42. The apparatus of claim 31, wherein said test waveforms comprise:

selectable, reduced amplitude replicas of current waveforms representing actual arcing events.

* * * * *